(12) United States Patent
Tsutsue et al.

(10) Patent No.: US 11,749,554 B2
(45) Date of Patent: Sep. 5, 2023

(54) MULTI-WAFER DEPOSITION TOOL FOR REDUCING RESIDUAL DEPOSITION ON TRANSFER BLADES AND METHODS OF OPERATING THE SAME

(71) Applicant: SANDISK TECHNOLOGIES LLC, Addison, TX (US)

(72) Inventors: Makoto Tsutsue, Yokkaichi (JP); Shunsuke Takuma, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 478 days.

(21) Appl. No.: 17/090,368

(22) Filed: Nov. 5, 2020

(65) Prior Publication Data

US 2022/0139758 A1    May 5, 2022

(51) Int. Cl.
    *H01L 21/02*      (2006.01)
    *H01L 21/687*      (2006.01)
    *C23C 16/455*      (2006.01)
    *H01L 21/67*      (2006.01)

(52) U.S. Cl.
CPC .. *H01L 21/68735* (2013.01); *C23C 16/45536* (2013.01); *H01L 21/02057* (2013.01); *H01L 21/02082* (2013.01); *H01L 21/67161* (2013.01)

(58) Field of Classification Search
CPC .......... H01L 21/02057; C23C 16/4405; C23C 16/4408
See application file for complete search history.

(56) References Cited

U.S. PATENT DOCUMENTS

| 7,516,833 | B2 * | 4/2009 | Todaka | H01L 21/68721 |
| | | | | 414/744.1 |
| 2018/0122633 | A1 * | 5/2018 | Leeser | H01L 21/6833 |
| 2019/0295880 | A1 | 9/2019 | Krishnan et al. | |
| 2020/0048770 | A1 | 2/2020 | Sakiyama et al. | |
| 2020/0141001 | A1 * | 5/2020 | Kato | C23C 16/45551 |
| 2020/0299835 | A1 * | 9/2020 | Ogawa | C23C 16/4405 |
| 2021/0013055 | A1 * | 1/2021 | Schaller | H01L 21/67161 |
| 2021/0013067 | A1 * | 1/2021 | Carlson | H01L 21/68707 |

(Continued)

OTHER PUBLICATIONS

U.S. Appl. No. 16/867,818, filed May 6, 2020, SanDisk Technologies LLC.

(Continued)

*Primary Examiner* — Jae Lee
(74) *Attorney, Agent, or Firm* — THE MARBURY LAW GROUP PLLC

(57) ABSTRACT

A multi-wafer deposition tool includes a vacuum enclosure including a platen laterally surrounding multiple wafer stages, a spindle-blade assembly including a spindle and multiple transfer blades attached to the spindle, and a controller configured to transfer wafers between the multiple wafer stages through rotation of the multiple transfer blades around a rotation axis pasting through the spindle. A chamber clean process may be performed while the transfer blades of the spindle-blade assembly are positioned over the multiple wafer stages. Alternatively or additionally, a deposition cycle may be performed while the transfer blades of the spindle-blade assembly are positioned between neighboring pairs of the wafer stages and while a purge gas that flows out of purge gas openings into spaces between the wafer stages.

20 Claims, 8 Drawing Sheets

(56) References Cited

U.S. PATENT DOCUMENTS

2022/0172967 A1* 6/2022 Topping ............ H01L 21/68764
2022/0262662 A1* 8/2022 Borth ................ H01L 21/68792

OTHER PUBLICATIONS

U.S. Appl. No. 16/867,845, filed May 6, 2020, SanDisk Technologies LLC.
U.S. Appl. No. 16/868,787, filed May 7, 2020, SanDisk Technologies LLC.
U.S. Appl. No. 16/897,679, filed Jun. 10, 2020, SanDisk Technologies LLC.
U.S. Appl. No. 16/897,717, filed Jun. 10, 2020, SanDisk Technologies LLC.
U.S. Appl. No. 16/900,126, filed Jun. 12, 2020, SanDisk Technologies LLC.
U.S. Appl. No. 16/987,717, filed Aug. 7, 2020, SanDisk Technologies LLC.

* cited by examiner

MULTI-WAFER DEPOSITION TOOL FOR REDUCING RESIDUAL DEPOSITION ON TRANSFER BLADES AND METHODS OF OPERATING THE SAME

FIELD

The present disclosure relates generally to the field of semiconductor manufacturing, and particularly to a multi-wafer deposition tool for reducing residual deposition of material on transfer blades and methods of operating the same.

BACKGROUND

A multi-wafer deposition tool can be employed to deposit various layers on a wafer, such as a semiconductor wafer. Such tools may be used for simultaneous chemical vapor deposition (CVD) or atomic layer deposition (ALD) of various layers on several wafers located in the same vacuum chamber.

SUMMARY

According to an aspect of the present disclosure, a method comprises: providing a multi-wafer deposition tool comprising a vacuum enclosure containing a platen laterally surrounding multiple wafer stages and comprising a spindle-blade assembly; loading wafers onto the multiple stages; positioning transfer blades of the spindle-blade assembly between neighboring pairs of the wafer stages while depositing a respective material layer on each of the wafers; transferring the wafers out of the vacuum enclosure; and performing a chamber clean process while the transfer blades of the spindle-blade assembly are positioned over the multiple wafer stages.

According to another aspect of the present disclosure, a method comprises: loading wafers onto multiple stages of a multi-wafer deposition tool comprising a vacuum enclosure containing a platen laterally surrounding the multiple wafer stages and a spindle-blade assembly; performing a deposition cycle in which a respective material layer is deposited on each of the wafers from process gas while transfer blades of the spindle-blade assembly are positioned between neighboring pairs of the wafer stages, and while an inert purge gas flows into locations between neighboring pairs of the wafer stages; and transferring the wafers out of the vacuum enclosure.

According to yet another aspect of the present disclosure, a multi-wafer deposition tool is provided, which comprises: a vacuum enclosure comprising a platen laterally surrounding multiple wafer stages; multiple showerheads located above a respective one of the multiple wafer stages; a spindle-blade assembly comprising a spindle and multiple transfer blades attached to the spindle; and a controller configured to transfer wafers between the multiple wafer stages through rotation of the multiple transfer blades around a rotation axis pasting through the spindle. The multi-wafer deposition tool comprises at least one feature selected from a first feature that the controller is configured to perform a chamber clean process while the transfer blades of the spindle-blade assembly are positioned over the multiple wafer stages; or a second feature that the controller is configured to perform a deposition cycle in which a respective reactant gas is distributed over the multiple wafer stages while the transfer blades of the spindle-blade assembly are positioned between neighboring pairs of the wafer stages and while an inert purge gas that flows out of purge gas openings is provided into locations between neighboring pairs of the wafer stages.

DETAILED DESCRIPTION

Figure 1:
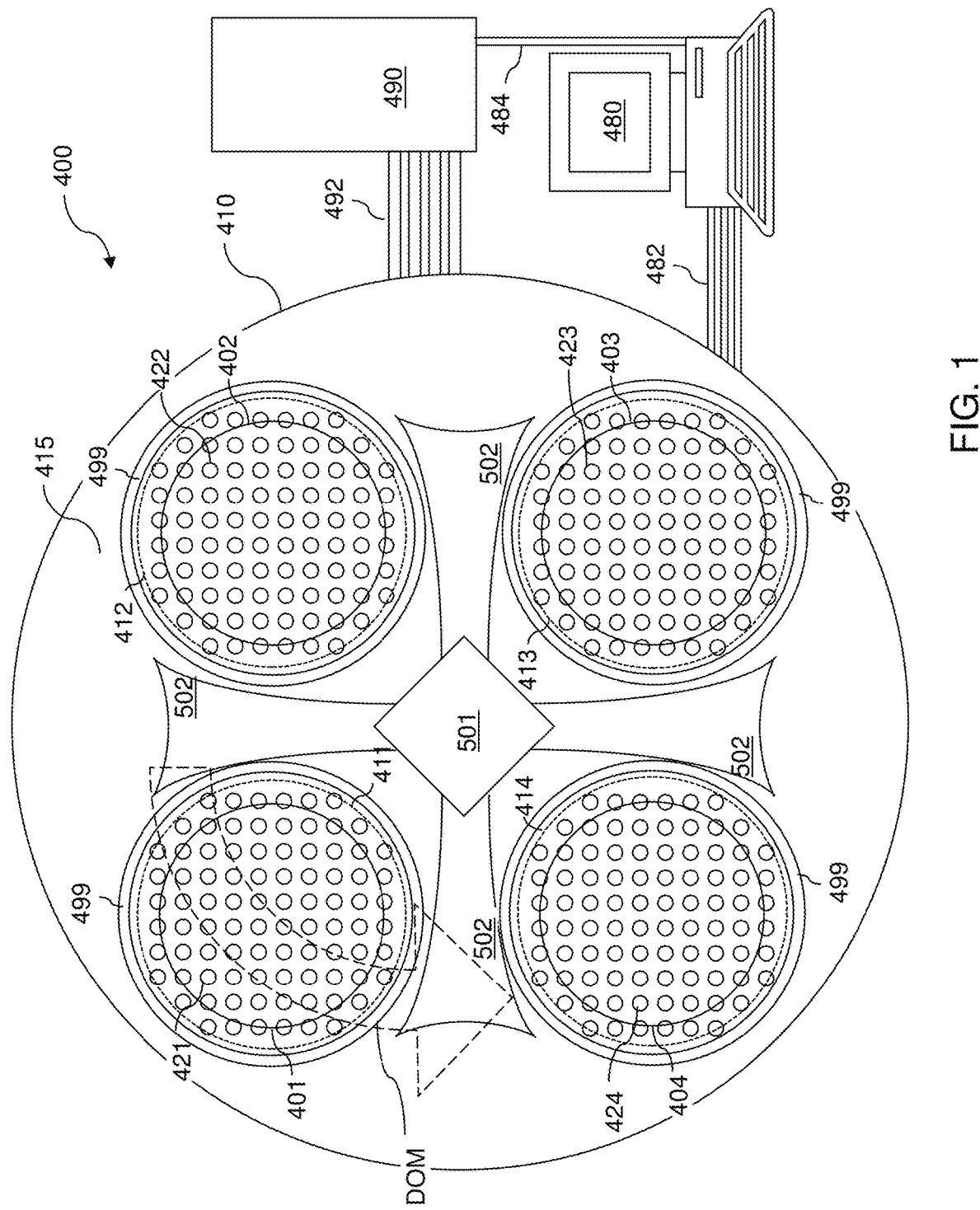
FIG. 1 is a schematic plan view of a first multi-wafer deposition tool during a deposition cycle according to the first embodiment of the present disclosure.

A multi-wafer deposition tool can be used to deposit alternating stacks of first material layers and second material layers over plural wafers located in the same vacuum chamber. Such an alternating stack can be employed to form a three-dimensional memory device, such as a vertical NAND memory device described in U.S. patent application Ser. No. 16/987,717 filed on Aug. 7, 2020 and incorporated herein by reference in its entirety. For example, an alternating stack of silicon oxide layers and silicon nitride layers can be employed to provide a vertically alternating sequence of silicon oxide insulating layers and silicon nitride sacrificial material layer, and the sacrificial material layers (can be subsequently replaced with electrically conductive layers (i.e., word lines/gate electrodes).

The multi-wafer deposition tool uses a spindle-blade assembly in order to facilitate transfer of the wafers (e.g., semiconductor wafers, such as silicon wafers or other substrates used for solid state layer deposition) between multiple deposition positions. The transfer blades of the spindle-blade assembly are placed in stages located between the deposition stages (i.e., pedestals) for the wafers during the deposition process. Thus, the amount of deposited material on the transfer blades is typically less than the amount of material deposited on the wafers. However, as collaterally deposited materials accumulate on the transfer blades, particles may be generated by flaking off the deposited material from the transfer blades. Embodiments of the present disclosure provide structures and methods for reducing particle generation from the transfer blades. As discussed above, the present disclosure is directed to a multi-wafer deposition tool for reducing residual material deposition on transfer blades and methods of operating the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface.

Figure 2A:
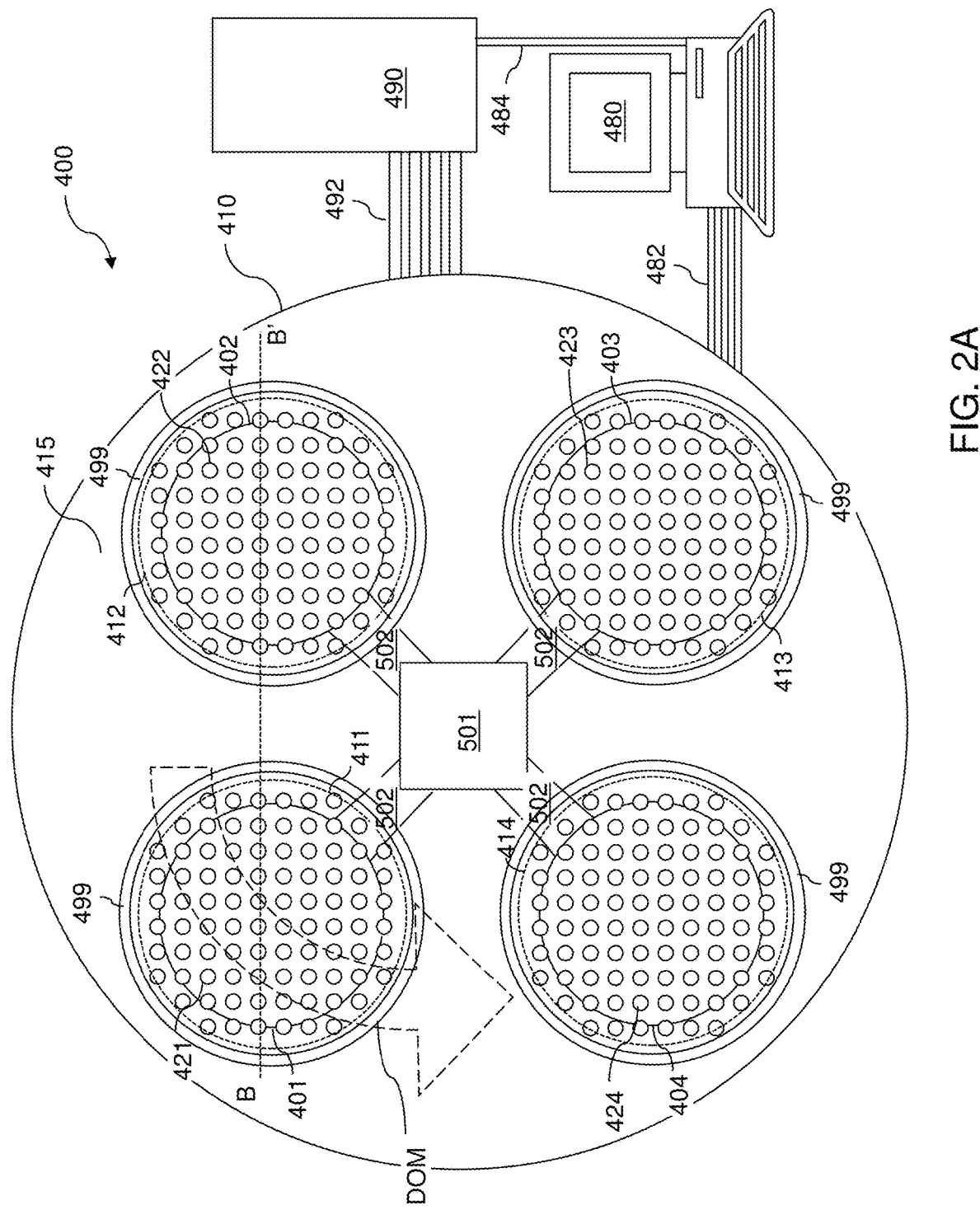
FIG. 2A is a schematic plan view of the first multi-wafer deposition tool while transfer blades are positioned underneath wafers according to the first embodiment of the present disclosure.
Figure 2B:
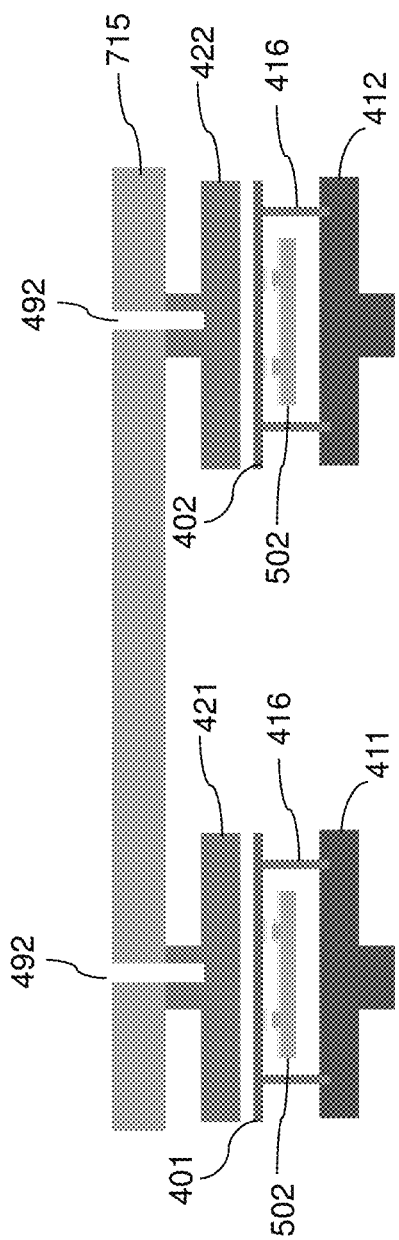
FIG. 2B is a schematic side cross-section view of the first multi-wafer deposition tool of FIG. 2A along line B-B' in FIG. 2A.
Figure 3:
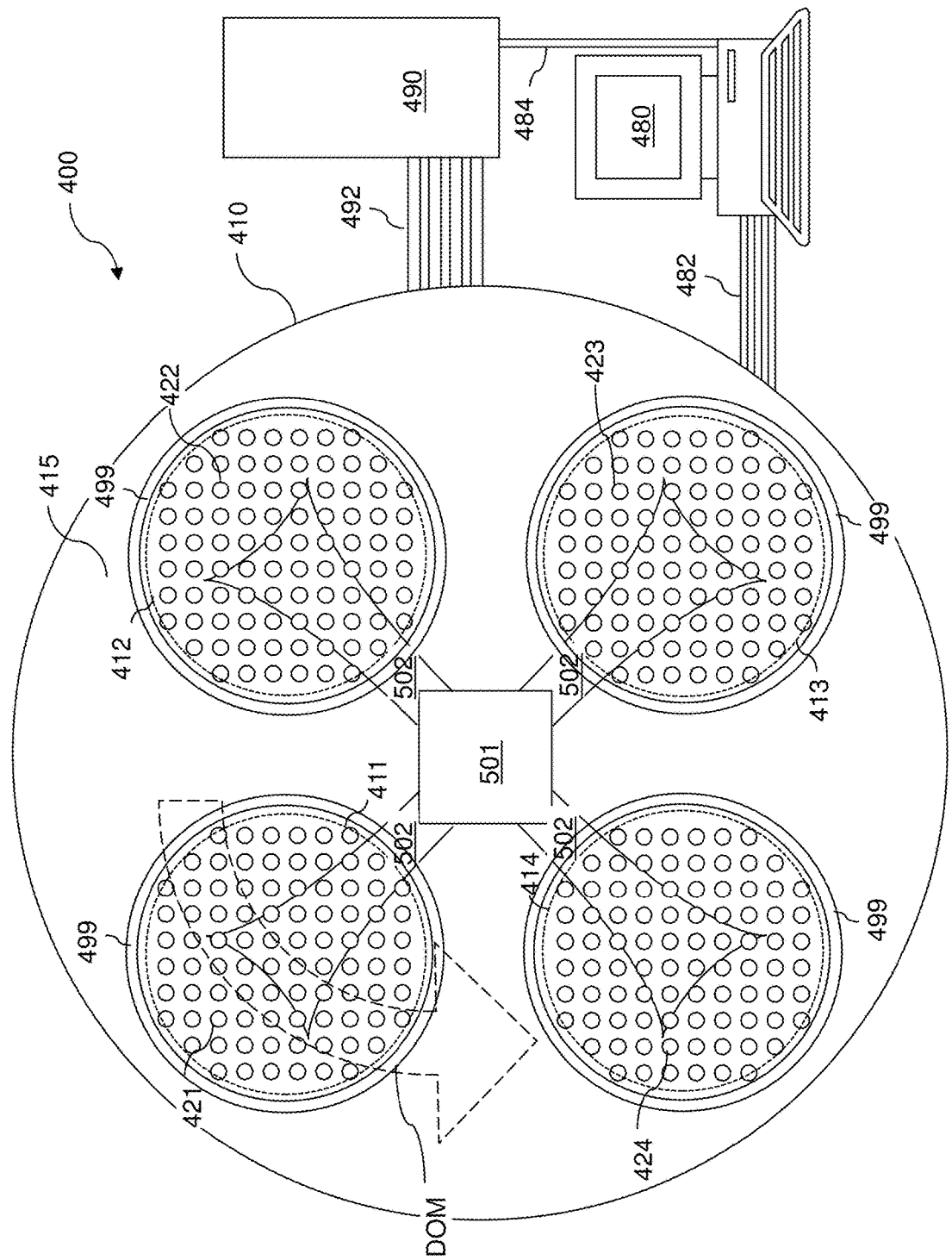
FIG. 3 is a schematic plan view of the first multi-wafer deposition tool during a chamber clean process according to the first embodiment of the present disclosure.

Referring to FIGS. 1-3, a first exemplary multi-wafer deposition tool 400 according to the first embodiment of the present disclosure is illustrated. FIG. 1 illustrates a configuration of the first exemplary multi-wafer deposition tool 400 during a deposition cycle. FIGS. 2A and 2B illustrates a configuration of the first exemplary multi-wafer deposition tool 400 during transfer of wafers (401, 402, 403, 404), and specifically, while transfer blades 502 are positioned underneath the wafers (401, 402, 403, 404) which are lifted up, for example by pins 416 shown in FIG. 2B, and over wafer stages (i.e., wafer support pedestals) (411, 412, 413, 414), i.e., between the wafers and the stages to move the wafers to the another stage in the tool 400. FIG. 3 illustrates a configuration of the first exemplary multi-wafer deposition tool 400 during a chamber clean process in which all wafers are removed from the vacuum enclosure 410. As used herein, a multi-wafer deposition tool refers to a deposition tool in which materials can be deposited on multiple wafers at a same time.

The first exemplary multi-wafer deposition tool 400 may be a chemical vapor deposition (CVD) or atomic layer deposition (ALD) apparatus which includes a process chamber comprising a vacuum enclosure 410 and configured to hold at least one wafer (401, 402, 403 and/or 404) therein. Each wafer (401, 402, 403 and/or 404) may comprise, for example, a commercially available silicon wafer that may, or may not, contain semiconductor devices formed thereupon. In one embodiment, the vacuum enclosure 410 can be configured to have a plurality of stages (411, 412, 413, 414) such as 2 to 20, for example 4 to 8 stages, such that the vacuum enclosure 410 can hold a plurality of wafers (401, 402, 403, 404), such as 2 to 20, for example 4 to 8 wafers, simultaneously, and to perform multiple deposition steps and/or multiple oxidation/nitridation steps simultaneously and/or sequentially.

The first exemplary multi-wafer deposition tool 400 can include a vacuum enclosure 410 containing a platen 415 as a bottom plate and containing a plurality of showerheads (421, 422, 423, 424) within the top plate (715 shown in FIG. 2B). A cylindrical or other suitably shaped sidewall can connect the bottom plate and the top plate of the vacuum enclosure 410. The platen 415 can include a plurality of openings (such as circular openings) therein such that the platen 415 laterally surrounds wafer stages (411, 412, 413, 414). The wafer stages function as deposition stations. Each deposition station can contain a respective support pedestal configured to hold a respective wafer (401, 402, 403, 404). In one embodiment, the plurality of wafer stages (411, 412, 413, 414) may protrude through a respective one of plurality of recesses or openings in the platen 415. The top surfaces of the wafer stages (411, 412, 413, 414) can be located within a same horizontal plane. In one embodiment, each of the wafer stages (411, 412, 413, 414) may hold one a plurality of wafers (401, 402, 403, 404) at a same level, i.e., within a same horizontal plane.

In one embodiment, the vacuum enclosure 410 may have a circular cylindrical shape in which the diameter of the bottom circular surface is selected to accommodate a plurality of wafer stages (411, 412, 413, 414) at a level of the bottom surface of the vacuum enclosure 410. In one embodiment, the platen 415 including the plurality of wafer stages (411, 412, 413, 414) can be mounted on the bottom surface of the vacuum enclosure 410.

The first multi-wafer deposition tool 400 can include a gas distribution manifold 490 configured to flow process gases and purge gases into the vacuum enclosure through gas lines 492, and a vacuum control system that includes vacuum pumps (not illustrated) connected to pumping ports 499 that are adjoined to the vacuum enclosure. In one embodiment, the pumping ports 499 can have a respective annular shape, and may laterally surround a respective one the plurality of wafer stages (411, 412, 413, 414). A temperature control mechanism (not shown) such as a heater, a cooler, and peripheral devices supporting operation of the heater and the cooler may be provided.

The showerheads (421, 422, 423, 424) can be located on the top plate of the vacuum enclosure. For example, a first showerhead 421 can be located over the first wafer stage 411, a second showerhead 422 can be located over the second wafer stage 412, a third showerhead 423 can be located over the third wafer stage 413, and a fourth showerhead 424 can be located over the fourth wafer stage 414. Each showerhead (421, 422, 423, 424) can include a respective set of openings that is configured to evenly distribute a process gas or an etchant gas over a respective wafer stage (411, 412, 413, 414).

A mechanism for moving the wafers (401, 402, 403 and/or 404) between the wafer stages (411, 412, 413, 414) can be provided. For example, a spindle-blade assembly (501, 502) comprising a spindle 501 and multiple transfer blades 502 attached to the spindle 501 can be provided. The spindle-blade assembly (501, 502) can be configured to rotate around a vertical axis passing through the spindle 501 along an azimuthal direction. An exemplary direction of movement DOM is schematically illustrated with dotted arrows. While a counter-clockwise direction of movement is shown, it should be understood that a clock-wise direction of movement may also be used.

The spindle-blade assembly (501, 502) can be configured to operate with pins (not illustrated) embedded in the wafer stages (411, 412, 413, 414) to enable transfer of the wafers (401, 402, 403 and/or 404) between the multiple wafer stages (411, 412, 413, 414). For example, a set of pins 416 (such as three or more pins 416 shown in FIG. 2B) that are azimuthally spaced apart around a vertical axis passing through a geometric center of a wafer stage (411, 412, 413, 414) can be provided within each wafer stage (411, 412, 413, 414). The set of pins can vertically move to lift a wafer (401, 402, 403, or 404) above the wafer stage (411, 412, 413, or 414). The spindle-blade assembly (501, 502) can rotate around a vertical axis passing through the spindle 501 as illustrated in FIG. 2A. The transfer blades 502 can be positioned underneath the wafers (401, 402, 403, 404) while the pins hold the wafers (401, 402, 403, 404) in lifted positions. The pins 416 can be retracted and the wafers (401, 402, 403, 404) can be placed on the transfer blades 502. The spindle-blade assembly (501, 502) can rotate such that the wafers (401, 402, 403, 404) can be positioned over different wafer stages (411, 412, 413, 414). Pins can be raised from the wafer stages (411, 412, 413, 414), and the spindle-blade assembly (501, 502) can rotate to move away from the wafer stages (411, 412, 413, 414). Subsequently, the pins can be lowered to complete transfer of the wafers (401, 402, 403, 404) onto different wafer stages (411, 412, 413, 414).

A controller 480 for controlling wafer movement and processing steps within the first multi-wafer deposition tool 400 can be provided. The controller 480 can control movement of the spindle-blade assembly (501, 502), pins within the wafer stages (411, 412, 413, 414), temperature and pressure within the vacuum enclosure 410, gas flow from the gas distribution manifold 490 within the vacuum enclosure 410, and any other process gas that may be needed for operation of the first multi-wafer deposition tool 400. Generally, the controller 480 comprises a processor in communication with a memory (e.g., a special or general purpose computer) and configured to execute an automated program that sequentially perform a set of processing steps. Control signals and feedback data signal can be communicated between the controller 480 and various components of the process chamber via signal cables 482 and/or via wireless communication.

The first multi-wafer deposition tool 400 may comprise at least one radio frequency (RF) signal generator (not illustrated) that is configured to generate a plasma within each volume between a respective facing pair of a showerhead (421, 422, 423, 424) and a wafer stage (411, 412, 413, 414) for a plasma enhanced deposition process, such as plasma enhanced CVD. The at least one RF generator may be mounted over, and/or under, the vacuum enclosure, i.e., outside the volume of the vacuum enclosure 410. Electrodes (not shown) and electrical feedthroughs may be provided in, and/or on, the vacuum enclosure 410.

The automated program includes various steps for depositing material layers on each of the wafers (401, 402, 403, 404). In one embodiment, the wafers (401, 402, 403, 404) can be loaded into the vacuum enclosure 410 of the process chamber one at a time, and can move around the various positions within the process chamber in a respective wafer stage (411, 412, 413, 414).

According to an aspect of the present disclosure, the first exemplary multi-wafer deposition tool 400 can comprise: a vacuum enclosure 410 comprising a platen 415 laterally surrounding multiple wafer stages (411, 412, 413, 414); a spindle-blade assembly (501, 5020 comprising a spindle 501 and multiple transfer blades 501 attached to the spindle 501; and a controller 480 configured to transfer wafers (401, 402, 403, 404) between the multiple wafer stages (411, 412, 413, 414) through rotation of the multiple transfer blades 502 around a rotation axis pasting through the spindle 501.

The first exemplary multi-wafer deposition tool 400 can be employed to deposit films on the top surfaces of the wafers (401, 402, 403, 404). A deposition cycle can be performed, which includes a set of processing steps for depositing a respective material layer on each of the wafers (401, 402, 403, 404) while the transfer blades 502 of the spindle-blade assembly (501, 502) are positioned between neighboring pairs of the wafer stages (411, 412, 413, 414) as illustrated in in the configuration of FIG. 1. For example, an alternating stack of first material layers and second material layers can be formed employing the first exemplary multi-wafer deposition tool 400. In one embodiment, the first material layers may be silicon oxide layers, and the second material layers may be silicon nitride layers. Generally, deposition of material layers in the first exemplary multi-wafer deposition tool 400 induces collateral deposition of material layers within the vacuum enclosure 410.

According to an aspect of the present disclosure, the first exemplary multi-wafer deposition tool 400 may be configured to enable a chamber clean process which also cleans the transfer blades 502 within the vacuum enclosure 410. The chamber clean process can be performed after performing a series of deposition cycles in the vacuum enclosure 410 that accumulates residual deposited material layers on the wafer stages (411, 412, 413, 414) and collateral deposition of materials occurs on the transfer blades 502. For example, the gas lines 492 may include an etchant gas supply line connected to each showerhead (421, 422, 423, 424), and the gas distribution manifold 490 may include a controller configured to control flow of an etchant gas through the etchant supply line. During the chamber clean process, the etchant gas can flow out of the showerheads (421, 422, 423, 424), and flow over the wafer stages (411, 412, 413, 414), and can be pumped out of the vacuum enclosure 410 through the pumping portions 499. For example, the etchant gas may include nitrogen trifluoride, and may be activated by generating a plasma.

According to an aspect of the present disclosure, the controller 480 can be configured to perform the chamber clean process while the transfer blades 502 of the spindle-blade assembly (501, 502) are positioned over the multiple wafer stages (411, 412, 413, 414) as illustrated in the configuration of FIG. 3. In other words, wafers (401, 402, 403, 404) are not present over the wafer stages (411, 412, 413, 414).

In one embodiment, the controller 480 can be configured to position the transfer blades 502 of the spindle-blade assembly (501, 502) over center regions of the multiple wafer stages (411, 412, 413, 414) for a period of time during the chamber clean process. In one embodiment, the controller 480 may be configured to position the transfer blades 502 of the spindle-blade assembly (501, 502) over the center regions of the multiple wafer stages (411, 412, 413, 414) during an entire time period of a plasma clean step in the chamber clean process. In another embodiment, the controller 480 may be configured to move the transfer blades 502 of the spindle-blade assembly (501, 502) between the center regions of the multiple wafer stages (411, 412, 413, 414) and regions located outside the multiple wafer stages (411, 412, 413, 414) during a plasma clean step in the chamber clean process to avoid blocking the stages with the transfer blades 502 during the entire clean cycle. In another embodiment, the controller 480 may be configured to move each of the transfer blades 502 of the spindle-blade assembly (501, 502) across a center region of a respective one of the multiple wafer stages (411, 412, 413, 414) along an azimuthal direction around a vertical axis passing through a spindle 501 of the spindle-blade assembly (501, 502) during a plasma clean step in the chamber clean process. The azimuthal movement of the transfer blades 502 may be performed continuously during the plasma clean step, or may be performed stepwise during the plasma clean step. Alternatively or additionally, multiple plasma clean steps may be employed during the chamber clean process, and the transfer blades 502 may be positioned over the wafer stages (411, 412, 413, 414) during a first subset of the plasma clean steps, and may be positioned between the wafer stages (411, 412, 413, 414) during a second subset of the plasma clean steps.

According to an aspect of the present disclosure, a method of operating a multi-wafer deposition tool 400 is provided. The method comprises: providing a multi-wafer deposition tool 400 comprising a vacuum enclosure 410 containing a platen 415 laterally surrounding multiple wafer stages (411, 412, 413, 414) and comprising a spindle-blade assembly (501, 502); loading wafers (401, 402, 403, 404) onto the multiple stages (411, 412, 413, 414); positioning transfer blades 502 of the spindle-blade assembly (501, 502) between neighboring pairs of the wafer stages (411, 412, 413, 414) while depositing a respective material layer on each of the wafers (401, 402, 403, 404); transferring the wafers (401, 402, 403, 404) out of the vacuum enclosure 410; and performing a chamber clean process while the transfer blades 502 of the spindle-blade assembly (501, 502) are positioned over the multiple wafer stages (411, 412, 413, 414).

In one embodiment, the transfer blades 502 of the spindle-blade assembly (501, 502) remain stationary over center regions of the multiple wafer stages (411, 412, 413, 414) for a period of time during the chamber clean process. In one embodiment, the transfer blades 502 of the spindle-blade assembly (501, 502) remain stationary over the center regions of the multiple wafer stages (411, 412, 413, 414) during an entire time period of a plasma clean step in the chamber clean process. In another embodiment, the transfer blades 502 of the spindle-blade assembly (501, 502) move between the center regions of the multiple wafer stages (411, 412, 413, 414) and regions located outside the multiple wafer stages (411, 412, 413, 414) during a plasma clean step in the chamber clean process. In one embodiment, each of the transfer blades 502 of the spindle-blade assembly (501, 502) moves across a center region of a respective one of the multiple wafer stages (411, 412, 413, 414) along an azimuthal direction around a vertical axis passing through a spindle 501 of the spindle-blade assembly (501, 502) during a plasma clean step in the chamber clean process.

In one embodiment, the chamber clean process employs a plasma clean process in which an etchant in a gas phase is activated into a plasma form. The wafers (401, 402, 403, 404) can be moved between the multiple wafer stages (411, 412, 413, 414) employing the transfer blades 502 of the spindle-blade assembly (501, 502) after depositing the respective material layers on each of the wafers (401, 401, 403, 404). A respective additional material layer can be deposited on each of the wafers (401, 402, 403, 404) after moving the wafers (401, 402, 403, 404). In one embodiment, an alternating stack of first material layers and second material layers can be formed on each of the wafers (401, 402, 403, 404). A plurality of first material layers and a plurality of second material layers can vertically alternate on each of the wafers (401, 402, 403, 404).

Figure 4:
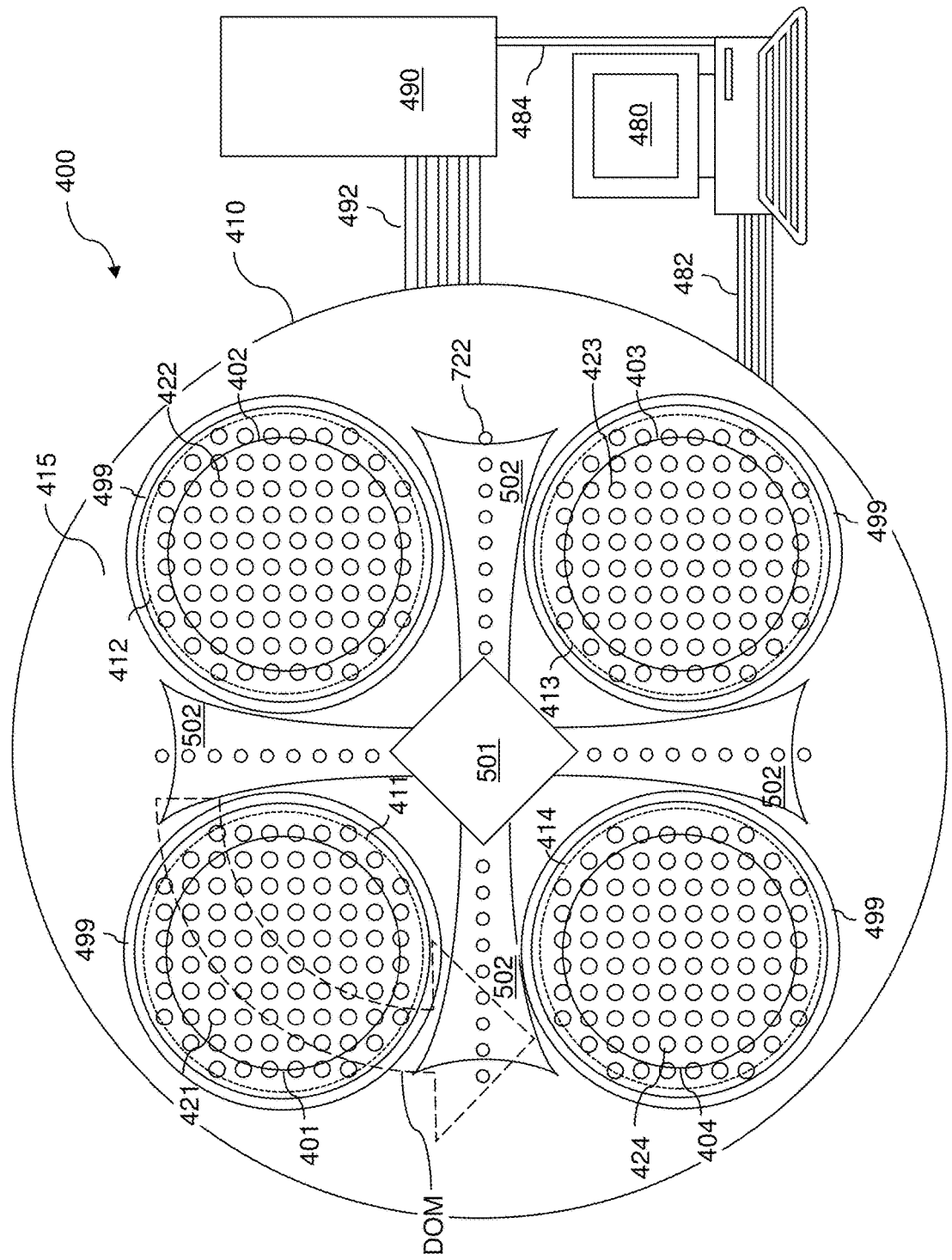
FIG. 4 is a schematic plan view of a second multi-wafer deposition tool during a deposition cycle according to the second embodiment of the present disclosure.
Figure 5:
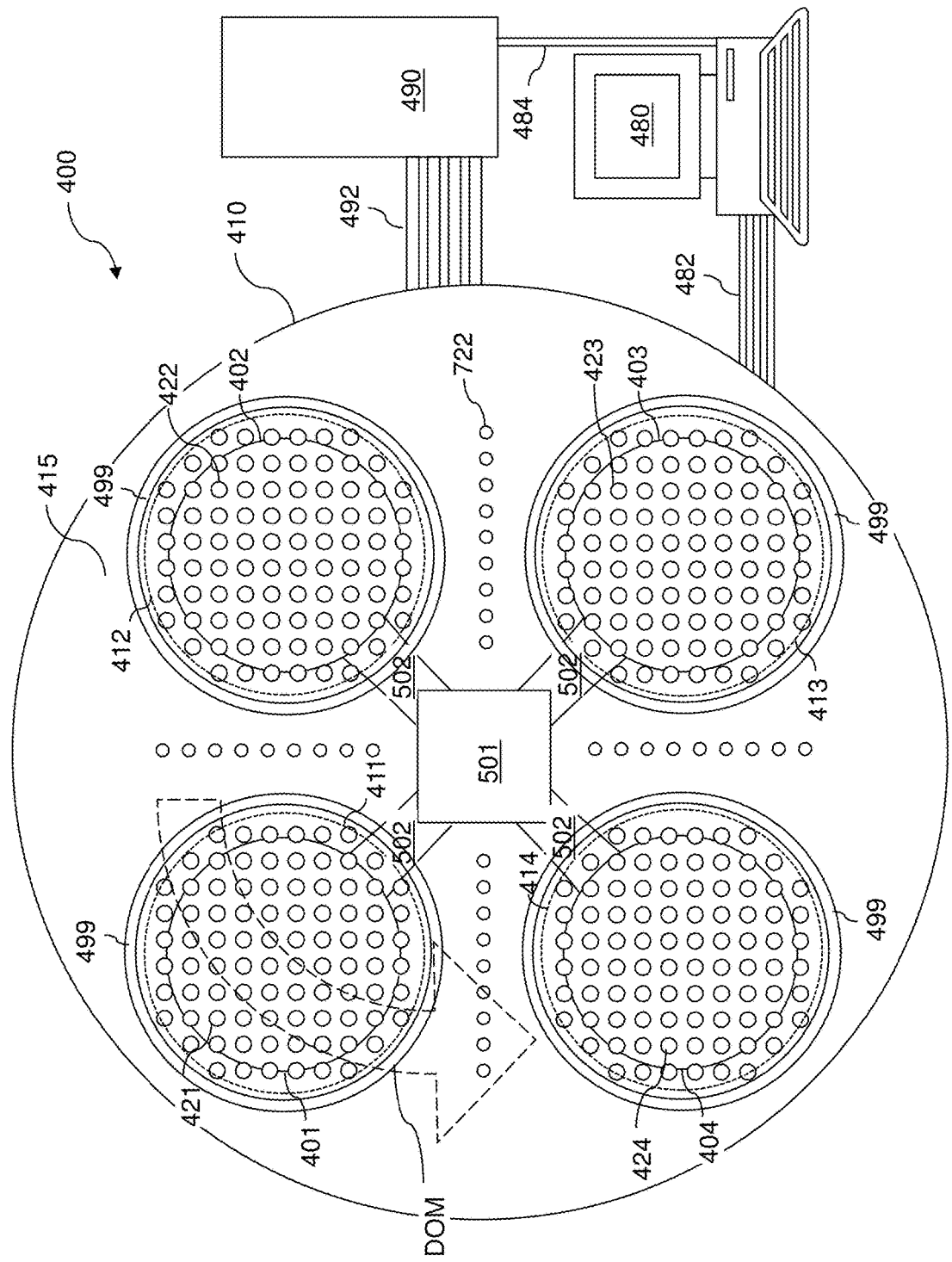
FIG. 5 is a schematic plan view of the second multi-wafer deposition tool while transfer blades are positioned underneath wafers according to the second embodiment of the present disclosure.
Figure 6:
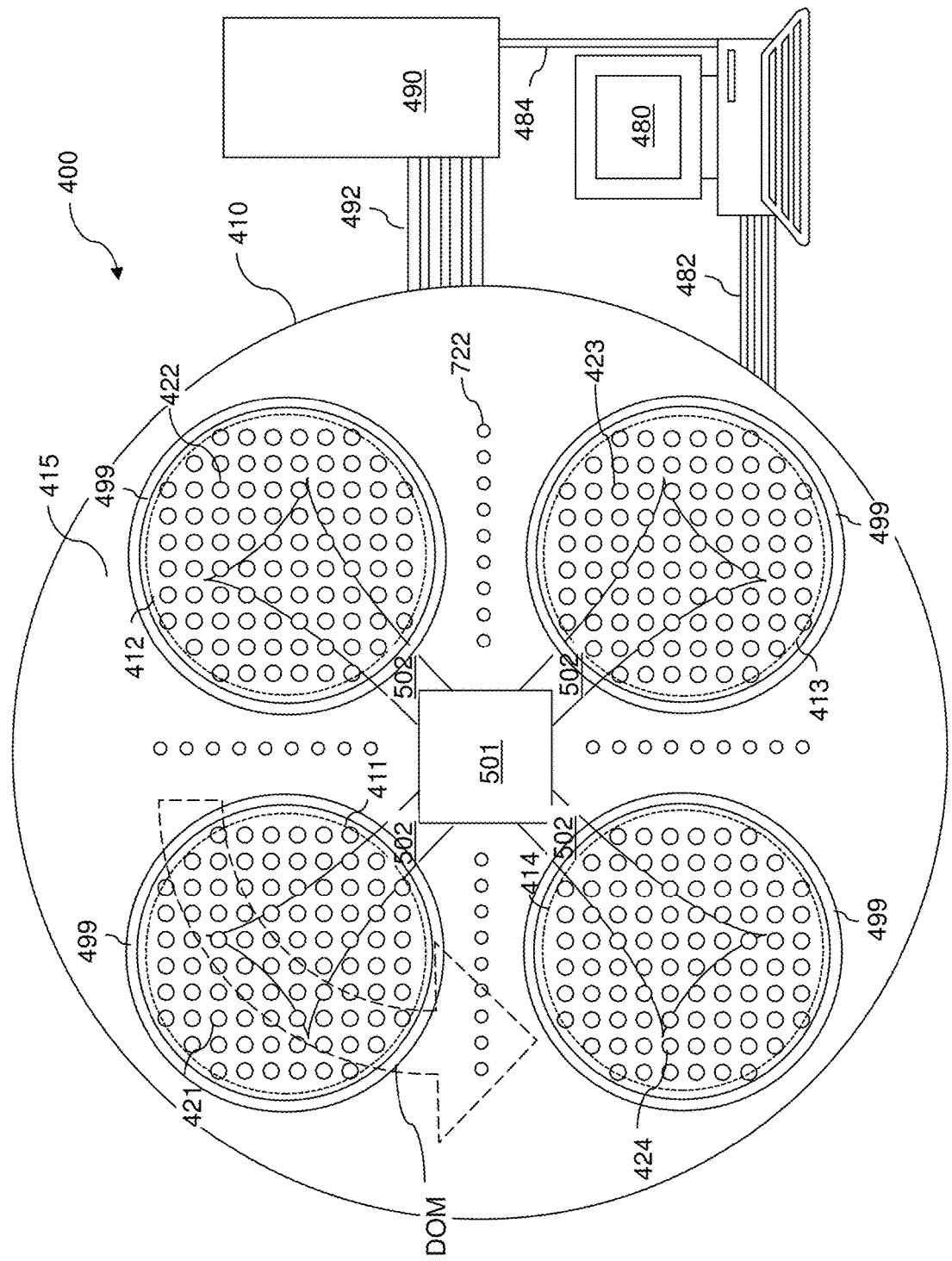
FIG. 6 is a schematic plan view of the second multi-wafer deposition tool during a chamber clean process according to the second embodiment of the present disclosure.

Referring to FIGS. 4-6, a second exemplary multi-wafer deposition tool 400 according to the second embodiment of the present disclosure is illustrated. FIG. 4 illustrates a configuration of the second exemplary multi-wafer deposition tool 400 during a deposition cycle. FIG. 5 illustrates a configuration of the second exemplary multi-wafer deposition tool 400 during transfer of wafers (401, 402, 403, 404), and specifically, while transfer blades 502 are positioned underneath the wafers (401, 402, 403, 404) which are lifted up for example by pins (not illustrated) and over wafer stages (411, 412, 413, 414). FIG. 6 illustrates a configuration of the second exemplary multi-wafer deposition tool 400 during a chamber clean process.

The second exemplary multi-wafer deposition tool 400 may be derived from the first exemplary multi-wafer deposition tool 400 by providing purge gas openings 722, such as nozzles, slits or other holes, which are configured to provide the purge gas into locations between neighboring pairs of wafer stages (411, 412, 413, 414). In the configuration shown in FIGS. 4 to 6, thus, the purge gas openings 722 are located over the area in which the transfer blades 502 are located during deposition cycles in which material layers are deposited on the wafers (401, 402, 403, 404) as illustrated in FIG. 4. In one embodiment, the flow of the purge gas out of the purge gas openings 722 can be directed at the top surfaces of the transfer blades 502.

Figure 7:
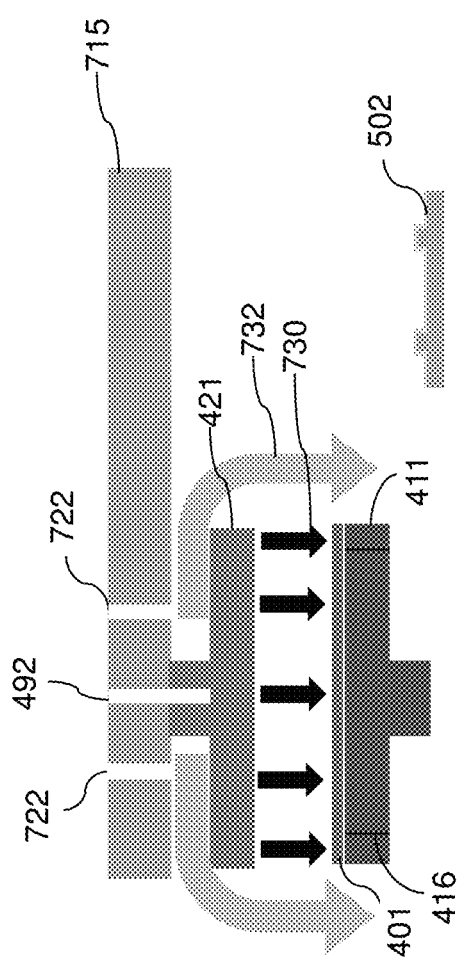
FIG. 7 is a schematic side cross-section view of a second multi-wafer deposition tool during a deposition cycle according to an alternative configuration of the second embodiment of the present disclosure.

In the alternative configuration shown in FIG. 7, the purge gas openings 722 are located in the top plate 715 of the chamber 410 over the top of the showerheads (only one showerhead 421 is shown in FIG. 7 for clarity). The purge gas 732 flows from the openings 722 and wraps around from the top of each of the showerheads 421 to the sides of each of the showerheads 421 to flow into locations between neighboring pairs of wafer stages (only one stage 411 is shown in FIG. 7 for clarity). At the same time, the process gas 730 flows from each showerhead 421 onto the respective wafer 401 located on the respective pedestal 411 below the respective showerhead 421.

The gas lines 492 can include a purge gas line, and the gas distribution manifold 490 can include a purge gas controller configured to control the flow of the purge gas out from the showerheads (421, 422, 423, 424) into the volume of the vacuum enclosure 410. The purge gas may comprise an inert gas, for example, nitrogen gas and/or argon gas. The purge gas can flow into the vacuum enclosure 410 toward the top surfaces of the transfer blades 502 during the deposition cycles, and can suppress and/or prevent deposition of materials on the transfer blades 502 during the deposition cycles. The purge gas can flow into the pumping ports 499 around the wafer stages (411, 412, 413, 414), and can be pumped out of the vacuum enclosure 410. Reduction and/or elimination of collaterally deposited materials on the surfaces of the transfer blades 502 during the deposition cycles can lengthen the time between the chamber clean cycles, and can reduce and/or eliminate generation of particles from flaking off of deposited materials from the transfer blades 502.

According to an aspect of the present disclosure, a multi-wafer deposition tool 400 is provided, which comprises: a vacuum enclosure 410 comprising a platen 415 laterally surrounding multiple wafer stages (411, 412, 413, 414); a spindle-blade assembly (501, 502) comprising a spindle 501 and multiple transfer blades 502 attached to the spindle 501; and a controller 480 configured to transfer wafers (401, 402, 403, 404) between the multiple wafer stages (411, 412, 413, 414) through rotation of the multiple transfer blades 502 around a rotation axis pasting through the spindle 501. The controller 480 can be configured to perform a deposition cycle in which a respective reactant gas is distributed over the multiple wafer stages (411, 412, 413, 414) while the transfer blades 502 of the spindle-blade assembly (501, 502) are positioned between neighboring pairs of the wafer stages (411, 412, 413, 414) and while a purge gas that flows out of purge gas openings 722 is directed at the transfer blades 502. Optionally, the controller 480 may be configured to perform a chamber clean process while the transfer blades 502 of the spindle-blade assembly (501, 502) are positioned over the multiple wafer stages (411, 412, 413, 414) as in the first exemplary multi-wafer deposition tool 400.

In one embodiment, the controller 480 can be configured to position the transfer blades 502 of the spindle-blade assembly (501, 502) between neighboring pairs of the multiple wafer stages (411, 412, 413, 414) during the deposition cycle. In one embodiment, the multi-wafer deposition tool 400 comprises multiple showerheads (421, 422, 423, 424) located above a respective one of the multiple wafer stages (411, 412, 413, 414); and the purge gas openings 722 are located above the spindle-blade assembly (501, 502) between a respective neighboring pair among the multiple showerheads (421, 422, 423, 424).

According to an aspect of the present disclosure, a method of operating a multi-wafer deposition tool 400 is provided. A multi-wafer deposition tool 400 is provided, which comprises a vacuum enclosure 410 containing a platen 415 laterally surrounding multiple wafer stages (411, 412, 413, 414), a spindle-blade assembly (501, 502), and purge gas openings 722 configured to provide a purge gas into a space located between the multiple wafer stages (411, 412, 413, 414). Wafers (401, 402, 403, 403) can be loaded onto the multiple stages (411, 412, 413, 414). A deposition cycle can be performed, in which a respective material layer is deposited on each of the wafers (401, 402, 403, 404) while transfer blades 502 of the spindle-blade assembly (501, 502) are positioned between neighboring pairs of the wafer stages (411, 412, 413, 414) and while a purge gas flows into the vacuum enclosure 410 through the purge gas openings 722 into a space between the stages. Subsequently, the wafers (401, 402, 403, 404) can be transferred out of the vacuum enclosure 410.

In one embodiment, the transfer blades 502 of the spindle-blade assembly (501, 502) remain stationary between neighboring pairs of the multiple wafer stages (411, 412, 413, 414) during the deposition cycle. In one embodiment shown in FIGS. 4-6, the multi-wafer deposition tool 400 comprises multiple showerheads (421, 422, 423, 424) located above a respective one of the multiple wafer stages (411, 412, 413, 414), and the purge gas openings 722 are located above the spindle-blade assembly (501, 502) between a respective neighboring pair among the multiple showerheads (421, 422, 423, 424). In an alternative embodiment shown in FIG. 7, the purge gas openings 722 are located above the showerheads (421, 422, 423, 424).

In one embodiment, the wafers (401, 402, 403, 404) can be moved between the multiple wafer stages (411, 412, 413, 414) employing the transfer blades 502 of the spindle-blade assembly (501, 502) after the deposition cycle, and an additional deposition cycle can be performed, in which a respective additional material layer is deposited on each of the wafers (401, 402, 403, 404) after moving the wafers (401, 402, 403, 404).

In one embodiment, the platen 415 comprises multiple annular pumping ports 499. Each of the multiple annular pumping ports 499 can laterally surround a respective one of the multiple wafer stages (411, 412, 413, 414). In one embodiment shown in FIGS. 4-6, the purge gas openings 722 can be directed at a top surface of a respective one of the transfer blades 502 of the spindle-blade assembly (501, 502) during the deposition cycle. In an alternative embodiment shown in FIG. 7, the purge gas openings 722 can be directed at a top surfaces of the showerheads (421, 422, 423, 424) such that the purge gas eventually flows between the respective stages (411, 412, 413, 414) and then into the vacuum ports 499. In this configuration, the purge gas 732 keeps the process gas 730 from flowing onto the transfer blades 502 during the deposition cycle. The purge gas 732 may also continue to flow during the wafer transfer cycle to reduce the amount of particles provided onto the transfer blades 502 during the wafer transfer cycle.

The various embodiments of the present disclosure can be employed to reduce collateral deposition of materials on the transfer blades 502 of the spindle-blade assembly (501, 502). Further, the various embodiments of the present disclosure can be employed to effectively etch any collaterally deposited material on the transfer blades 502 of the spindle-blade assembly (501, 502) during a chamber clean process by at least temporarily positioning the transfer blades 502 between the showerheads (421, 422, 423, 424) and the wafer stages (411, 412, 413, 414) so that the plasma of the etchant gas can etch the collaterally deposited material on the transfer blades 502.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A method, comprising:
providing a multi-wafer deposition tool comprising a vacuum enclosure containing a platen laterally surrounding multiple wafer stages and comprising a spindle-blade assembly;
loading wafers onto the multiple stages;

positioning transfer blades of the spindle-blade assembly between neighboring pairs of the wafer stages while depositing a respective material layer on each of the wafers;

transferring the wafers out of the vacuum enclosure; and performing a chamber clean process while the transfer blades of the spindle-blade assembly are positioned over the multiple wafer stages.

2. The method of claim 1, wherein the transfer blades of the spindle-blade assembly remain stationary over center regions of the multiple wafer stages for a period of time during the chamber clean process.

3. The method of claim 2, wherein the transfer blades of the spindle-blade assembly remain stationary over the center regions of the multiple wafer stages during an entire time period of a plasma clean step in the chamber clean process.

4. The method of claim 2, wherein the transfer blades of the spindle-blade assembly move between the center regions of the multiple wafer stages and regions located outside the multiple wafer stages during a plasma clean step in the chamber clean process.

5. The method of claim 1, wherein each of the transfer blades of the spindle-blade assembly moves across a center region of a respective one of the multiple wafer stages along an azimuthal direction around a vertical axis passing through a spindle of the spindle-blade assembly during a plasma clean step in the chamber clean process.

6. The method of claim 1, wherein the chamber clean process employs a plasma clean process in which an etchant in a gas phase is activated into a plasma form.

7. The method of claim 1, further comprising:

moving the wafers between the multiple wafer stages employing the transfer blades of the spindle-blade assembly after depositing the respective material layers on each of the wafers; and depositing a respective additional material layer on each of the wafers after moving the wafers.

8. A method, comprising:

loading wafers onto multiple stages of a multi-wafer deposition tool comprising a vacuum enclosure containing a platen laterally surrounding the multiple wafer stages and a spindle-blade assembly;

performing a deposition cycle in which a respective material layer is deposited on each of the wafers from process gas while transfer blades of the spindle-blade assembly are positioned between neighboring pairs of the wafer stages, and while an inert purge gas flows into locations between neighboring pairs of the wafer stages; and transferring the wafers out of the vacuum enclosure.

9. The method of claim 8, wherein the transfer blades of the spindle-blade assembly remain stationary between neighboring pairs of the multiple wafer stages during the deposition cycle.

10. The method of claim 8, wherein the multi-wafer deposition tool comprises multiple showerheads located above a respective one of the multiple wafer stages, wherein the process gas flows from the multiple showerheads to the wafers during the deposition cycle.

11. The method of claim 10, wherein purge gas openings are located above the spindle-blade assembly between a respective neighboring pair among the multiple showerheads, such that the inert purge gas is directed at a top surface of a respective one of the transfer blades of the spindle-blade assembly during the deposition cycle.

12. The method of claim 10, wherein the purge gas openings are located above multiple showerheads such that the inert purge gas is directed at a top surface of multiple showerheads and then flows into the locations between neighboring pairs of the wafer stages during the deposition cycle.

13. The method of claim 8, further comprising:

moving the wafers between the multiple wafer stages employing the transfer blades of the spindle-blade assembly after the deposition cycle; and performing an additional deposition cycle in which a respective additional material layer is deposited on each of the wafers after moving the wafers.

14. A multi-wafer deposition tool comprising:

a vacuum enclosure comprising a platen laterally surrounding multiple wafer stages;

multiple showerheads located above a respective one of the multiple wafer stages;

a spindle-blade assembly comprising a spindle and multiple transfer blades attached to the spindle; and a controller configured to transfer wafers between the multiple wafer stages through rotation of the multiple transfer blades around a rotation axis pasting through the spindle, wherein the multi-wafer deposition tool comprises at least one feature selected from:

a first feature that the controller is configured to perform a chamber clean process while the transfer blades of the spindle-blade assembly are positioned over the multiple wafer stages; or a second feature that the controller is configured to perform a deposition cycle in which a respective reactant gas is distributed over the multiple wafer stages while the transfer blades of the spindle-blade assembly are positioned between neighboring pairs of the wafer stages and while an inert purge gas that flows out of purge gas openings is provided into locations between neighboring pairs of the wafer stages.

15. The multi-wafer deposition tool of claim 14, wherein:

the multi-wafer deposition tool comprises the first feature; and the controller is configured to position the transfer blades of the spindle-blade assembly over center regions of the multiple wafer stages for a period of time during the chamber clean process.

16. The multi-wafer deposition tool of claim 15, wherein the controller is configured to position the transfer blades of the spindle-blade assembly over the center regions of the multiple wafer stages during an entire time period of a plasma clean step in the chamber clean process.

17. The multi-wafer deposition tool of claim 15, wherein the controller is configured to move the transfer blades of the spindle-blade assembly between the center regions of the multiple wafer stages and regions located outside the multiple wafer stages during a plasma clean step in the chamber clean process.

18. The multi-wafer deposition tool of claim 14, wherein:

the multi-wafer deposition tool comprises the first feature; and the controller is configured to move each of the transfer blades of the spindle-blade assembly across a center region of a respective one of the multiple wafer stages along an azimuthal direction around a vertical axis passing through a spindle of the spindle-blade assembly during a plasma clean step in the chamber clean process.

19. The multi-wafer deposition tool of claim 14, wherein:

the multi-wafer deposition tool comprises the second feature;

the purge gas openings are located above the spindle-blade assembly between a respective neighboring pair among the multiple showerheads; and the controller is configured to position the transfer blades of the spindle-blade assembly between neighboring pairs of the multiple wafer stages during the deposition cycle.

20. The multi-wafer deposition tool of claim 19, wherein:

the multi-wafer deposition tool comprises the second feature;

the purge gas openings are located above the multiple showerheads; and the controller is configured to position the transfer blades of the spindle-blade assembly between neighboring pairs of the multiple wafer stages during the deposition cycle.

* * * * *